United States Patent [19]

Kim

[11] Patent Number: 5,063,420
[45] Date of Patent: Nov. 5, 1991

[54] METHOD FOR MAKING AN LED ARRAY
[75] Inventor: Ki-Joon Kim, Seoul, Rep. of Korea
[73] Assignee: SamSung Electronics Co., Ltd., Suwon, Rep. of Korea
[21] Appl. No.: 440,673
[22] Filed: Nov. 24, 1989
[30] Foreign Application Priority Data Nov. 17, 1988 [KR] Rep. of Korea ............... 1988-15121

[51] Int. Cl.$^5$ .............................................. H01L 33/00
[52] U.S. Cl. ....................................... 357/17; 357/70; 357/71; 357/65
[58] Field of Search .................... 357/70, 71, 17, 23.4, 357/65

[56] References Cited

U.S. PATENT DOCUMENTS

| | | | |
|---|---|---|---|
| 3,636,617 | 1/1972 | Schmidt et al. | 357/17 |
| 4,677,453 | 6/1987 | Matsumoto et al. | 357/23.4 |
| 4,924,276 | 5/1990 | Heime et al. | 357/65 |

Primary Examiner—Eugene R. LaRoche
Assistant Examiner—R. Ratliff
Attorney, Agent, or Firm—Robert E. Bushnell

[57] ABSTRACT

There is disclosed a method for making a light-emitting diode array capable of realizing large output and large-scale integration by using a heterogenous film which can electrically insulate between LEDs, (LEDs) by the diffusion of an impurity into a substrate. The improved LED array manufacturing method includes the steps of: forming a luminescent layer, of a first conductivity type, a transparent layer and a cap-layer over the semiconductor substrate; forming of a cap layer made into a given pattern by etching a given portion of said cap layer; forming of a diffusion region converted into the first conductivity type by the injection of an impurity into a given portion of the transparent layer; forming an oxide film on the entire surface except the area where the cap layer is covering the transparent layer; and forming an electrode over the cap layer and a common electrode under the semiconductor substrate.

35 Claims, 2 Drawing Sheets (PRIOR ART)

METHOD FOR MAKING AN LED ARRAY

BACKGROUND OF THE INVENTION

1. Field of the Invention

The present invention relates to a light-emitting diode (LED) array and, more particularly, to a method for making a LED array capable of realizing a large output and a large-scale integration by using a heterogenous film which can electrically insulate between LEDs by the diffusion of an impurity into a substrate.

2. Description of the Prior Art

At a high information-oriented age, as the data processing capacity of automatic devices such as computers increase continuously, a printer as a data outputing device also requires high-speed, high-resolution and multi-functions. As a result, to meet such a requirement, a LED array in an LED printer utilizing an electrophotographic technique is asked for large output and large-scale integration.

FIG. 1 is a schematic diagram showing a portion of a known LED array. There is explained a preferred embodiment by the prior art. Over an N-type GaAs substrate 1 is entirely formed an N-type GaAsP film 2 and selectively formed an insulating film 3 given portions, there is formed a zinc diffusion region 4 over the parts of the N-type GaAsP film 2 on which the insulating film 3 is not formed. Also, a P-type electrode 5 from a side of the zinc diffusion region 4 to the upper insulating film 3 and a N-type common electrode 6 under the N-type GaAsP substrate 1 are formed. The region, wherein the insulating film 3 is not formed, is utilized as a luminescent region 7. There is formed a P-N junction between the N-type GaAsP film 2 and the P-type zinc diffusion region 4 formed by the diffusion of zinc into the N-type GaAsP film 2. Therefore, when a voltage is now applied between the N-type common electrode 6 and the P-type electrode 5, a light emission is radiated from the luminescent region 7.

However, the P-N junction formed by the same material as above mentioned becomes Homojunction, so that it has a problem that a high-speed printing is difficult due to a small luminescent output at the junction interfaces. Moreover in another preferred embodiment of the prior art, if Mesa etching is performed for separating between elements after growing heterogeneous film for increasing a luminescent output, it has a difficult problem in that the forming electrode and a large-scale integration cannot be successfully achieved because the surface of chip isn't flatten.

SUMMARY OF THE INVENTION

It is therefore an object of the present invention to provide a LED array capable for a large output by using a heterojunction.

It is another object of the present invention to provide a LED array and its manufacturing method capable of realizing a large-scale integration by means of the injection of impurity so as to separate between elements.

To achieve the above described objects of the present invention, the inventive method comprises the steps of:

Sequentially forming a luminescent layer of a first conductivity type over a semiconductor substrate of the first conductivity type, a transparent layer having a wide forbidden band gap and being a second conductivity type as a opposite conductivity type of the first conductivity type, and a cap layer of a highly doped second conductivity type;

Leaving a portion of the cap layer to contact an electrode metal by chemical etching;

Converting a given transparent layer of the second conductivity type into a first conductivity type;

Forming an oxide film over the said transparent layer, and, next, a second electrode over said cap layer; and Forming a common electrode of a first conductivity type below said semiconductor substrate.

BRIEF DESCRIPTION OF THE DRAWINGS

The features and advantages of the process according to the present invention will now be explained hereinafter with reference to the accompanying drawings, wherein.

DETAILED DESCRIPTION OF THE INVENTION

Figure 1:
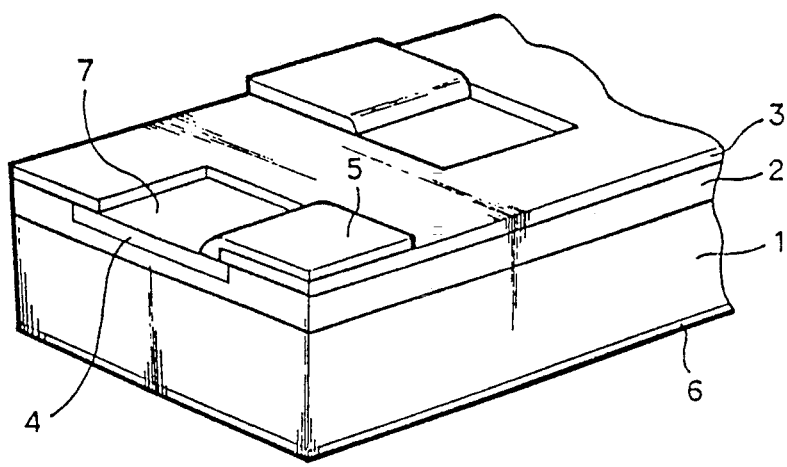
FIG. 1 is a schematic diagram of a known LED array.
Figure 2:
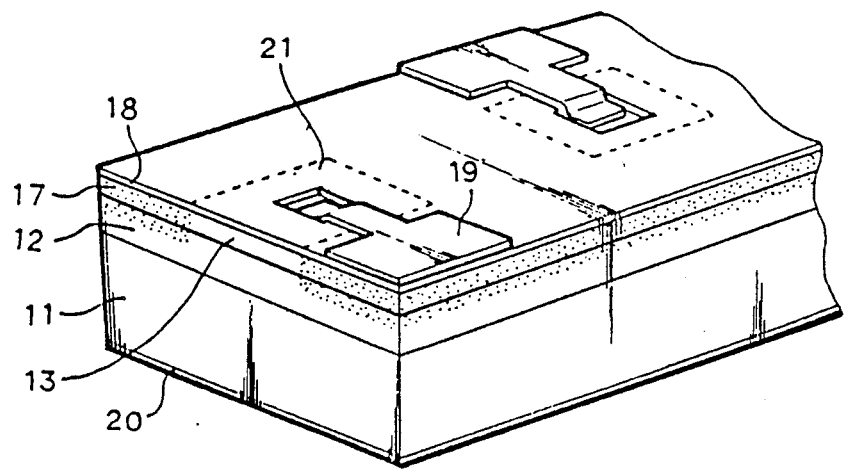
FIG. 2 is a schematic diagram of an LED array according to the present invention.
Figure 3:
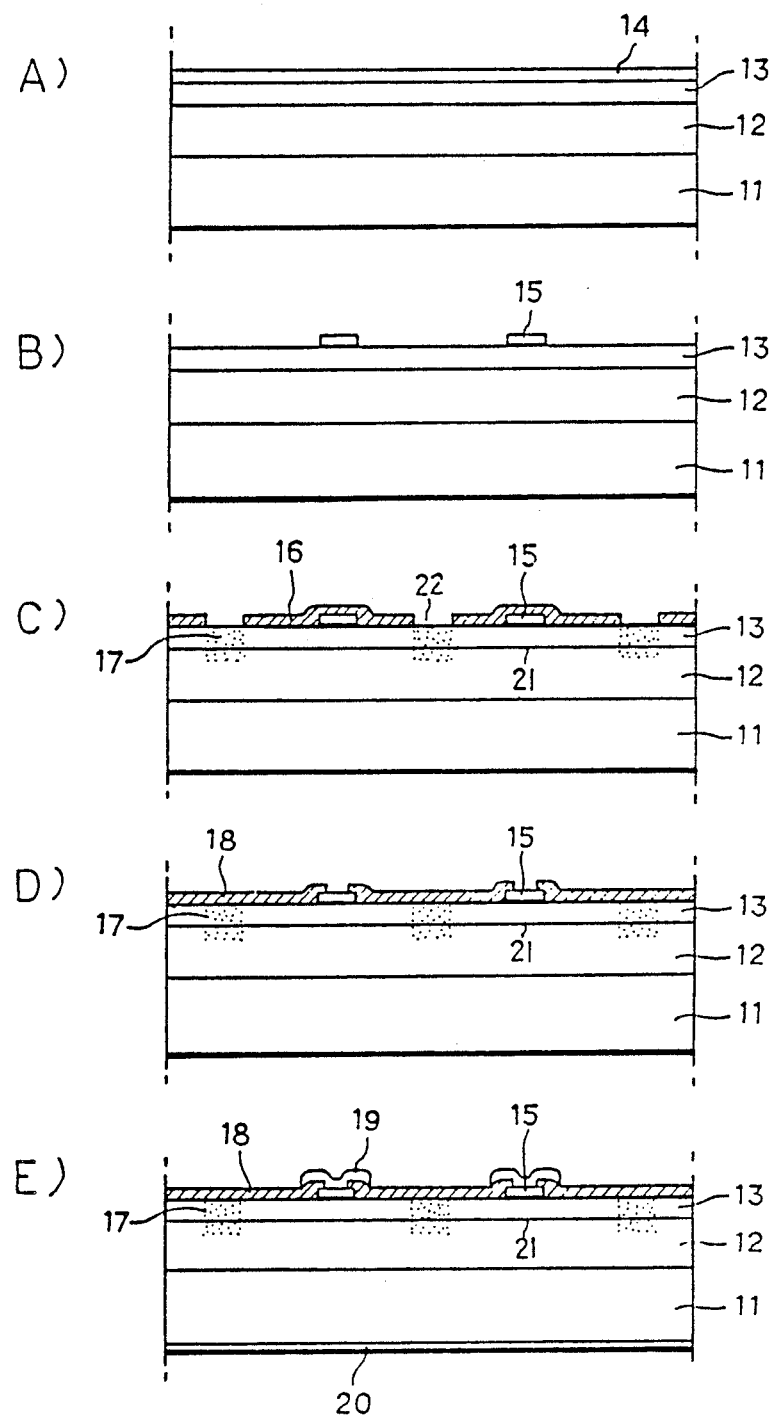
FIGS. 3(A) to (E) are cross-sectional views showing each stage of manufacturing the LED array according to the present invention.

FIGS. 3(A) to (E) are cross-sectional views illustrating the processing stages of manufacturing a GaAs LED array as a preferred embodiment according to the invention. The starting material is a <100> oriented GaAs substrate 11 with zinc impurity dose of $10^{19}/cm^3$. As shown in FIG. 3(A), a luminescent layer 12 of $Ga_1Al_xAs$ with zinc impurity dose of $10^{18}/cm^3$, a transparent layer 13 of $Ga_{1-y}Al_yAs$ with Te impurity dose of $5\times10^{17}/cm^3$, and N-type cap layer 14 are sequentially grown over the GaAs substrate 11 by a conventional Liquid Phase Epitaxy technique. In said FIG's, the transparent layer 13 must have a wider forbidden bandgap than that of the luminescent layer 12 in order that the light emitted from the luminescent layer 12 can efficiently radiate to the outside, namely, it must be $Y>X$. In addition, in order to improve electrical contact with an electric electrode, the N-type cap layer 14 is doped with Te impurity dose above $2\times10^{18}/cm^3$.

FIG. 3(B) shows that since the N-type cap layer 14 absorbs the light emitted in the luminescent layer 12, the light intensity being radiated to the outside is decreased. Therefore, only a portion of N-type cap layers 15 are left in contact with an electrode metal by conventional photolithography method.

Thereafter, as shown in FIG. 3(C), after forming a nitride film 16 for selective diffusion over the substrate in FIG. 3(B), there is a window 22 is formed by a conventional photolithography technique. Then, by means of the zinc diffusion through the window 22, a diffusion region 17 is formed, said diffusion region being a portion of the N-type transparent layer 13 is converted into a P-type. The zinc diffusion region 17 is formed by a general diffusion technique of vacuum sealing and by a select diffusion method utilizing each of the nitride film, so that a luminescent regions are isolated to a given region by the n-p-n junction.

After this processing, as shown in FIG. 3(D), the nitride film 16 is removed. By use of a conventional Chemical Vapor Deposition (CVD) method, an oxide film 18 is deposited, and then a window is formed over the N-type cap layer 15 by using a photolithography method. FIG. 3(E) shows that an N-type electrode of a given pattern is formed over the N-type cap layers 15 through the window by a Lift-off method, and a P-type electrode 20 being utilized as a common electrode is formed below the GaAs substrate 11. Then, the N-type electrode 19 comprises AuGe/Ni/Au, and the P-type electrode 20 Au/Zn alloy.

A method of making an LED array has now been explained in which a luminescent layer is limited to a given region by the diffusion of zinc using a P-type GaAs substrate, but it will be understood by those skilled in the art that modifications in detail may be made therein without departing from the spirit and scope of the invention. For example, in order to separate between elements, there can be performed ion implantation substitute for a diffusion method.

Accordingly the present invention has advantages that the emitting light has a large output because a P-N junction is formed by the growth of a heterogeneous crystal film, and the surface is flattened by separating between elements by the diffusion of impurity, so that the realization of a large-scale integration can be achieved.

Although specific constructions and procedures of the invention have been illustrated and described herein, it is not intended that the invention be limited to the elements and constructions disclosed. One skilled in the art will easily recognize that particular elements or subconstructions may be used without departing from the scope and spirit of the invention.

What is claimed is:

1. A light emitting diode array formed over a semiconductor substrate, comprising:
    a luminescent layer of a first conductivity type and a transparent layer of a second conductivity type, said layers forming a heterogeneous P-N junction over said semiconductor substrate;
    a cap layer of the second conductivity type over said transparent layer of the second conductivity type containing impurities for improving electrical contact with an electrode of the second conductivity type;
    a diffusion region of the first conductivity type formed spaced apart from said cap layer, inside said transparent layer of the second conductivity type for dividing said transparent layer into a plurality of elements;
    an insulating film formed over an entire surface of said transparent layer except said cap layer of the second conductivity type and, next, a second electrode over said cap layer; and
    a common electrode of the first conductivity type placed under said semiconductor substrate of the first conductivity type.

2. A light emitting diode array formed over a semiconductor substrate, comprising:
    a luminescent layer;
    a transparent layer forming a hetergeneous P-N junction with said luminescent layer;
    a cap layer formed over said transparent layer;
    a diffusion region formed spaced apart from said cap layer and inside said transparent layer;
    an insulating film formed over an entire surface of said transparent layer except said cap layer; and
    a common electrode placed under said semiconductor substrate.

3. An array as claimed in claim 1, wherein said luminescent layer is of a first conductivity type.

4. An array as claimed in claim 3, wherein said transparent layer is of a second conductivity type.

5. An array as claimed in claim 4, wherein said P-N junction formed by said luminescent and transparent layers is over said semiconductor substrate.

6. An array as claimed in claim 5, wherein said semiconductor substrate, diffusion region and said common electrode are of said first conductivity type.

7. An array as claimed in claim 6, wherein said cap layer and insulating film are of said second conductivity type.

8. The light emitting diode array of claim 1, further comprising:
    said luminescent layer exhibiting a first bandgap, and
    said transparent layer exhibiting a second bandgap greater than said first bandgap.

9. The light emitting diode array of claim 1, further comprised of areas of said transparent layer of said second conductivity type being separated by said diffusion region of the first conductivity type.

10. The light emitting diode array of claim 1, further comprised of said plurality of elements of said transparent layer exhibiting said second conductivity type and being separated by said diffusion region.

11. The light emitting diode array of claim 1, further comprised of:
    said luminescent layer being made of $Ga_{1-x}Al_xAs$, and
    said transparent layer being made of $Ga_{1-y}Al_yAs$, wherein $y > x$.

12. The light emitting diode array of claim 1, further comprised of said cap layer being doped with impurities at a dose above $2 \cdot 10^{18}$ per cubic centimeter.

13. The light emitting diode array of claim 8, further comprised of:
    said plurality of elements of said transparent layer exhibiting said second conductivity type and being separated by said diffusion region.

14. The light emitting diode array of claim 2, further comprising:
    said luminescent layer exhibiting a first bandgap, and
    said transparent layer exhibiting a second bandgap greater than said first bandgap.

15. The light emitting diode array of claim 2, further comprised of:
    said diffusion region being of a first conductivity type and dividing said transparent layer into a plurality of elements; and
    areas of said transparent layer exhibiting said second conductivity type, with each of said areas being separated by said diffusion region.

16. The light emitting diode array of claim 2, further comprised of:
    said luminescent layer being made of $Ga_{1-x}Al_xAs$, and
    said transparent layer being made of $Ga_{1-y}Al_yAs$, wherein $y > x$.

17. The light emitting diode array of claim 2, further comprised of said cap layer being doped with impurities at a dose above $2 \cdot 10^{18}$ per cubic centimeter.

18. The light emitting diode array of claim 15, further comprised of:
    said luminescent layer being made of $Ga_{1-x}Al_xAs$, and
    said transparent layer being made of $Ga_{1-y}Al_yAs$, wherein $y > x$.

19. The light emitting diode array of claim 15, further comprised of said cap layer being doped with impurities at a dose above $2 \cdot 10^{18}$ per cubic centimeter.

20. The light emitting diode array of claim 18, further comprised of said cap layer being doped with impurities at a dose above $2 \cdot 10^{18}$ per cubic centimeter.

21. A light emitting diode array, comprising:
a semiconductor substrate of a first conductivity type;
a luminescent layer of said first conductivity type disposed upon said substrate, said luminescent layer exhibiting a first bandgap;
a transparent layer of a second and opposite conductivity type disposed upon said luminescent layer, said transparent layer exhibiting a second bandgap greater than said first bandgap;
a plurality of spaced-apart cap layers of said second conductivity type doped with an impurity, disposed on said transparent layer;
an insulating layer disposed over said transparent layer and around said cap layers, with a plurality of spaced-apart openings extending through said insulating layer to expose said transparent layer;
a plurality of regions of said first conductivity type disposed into said transparent layer, said plurality of regions being spaced-apart from said cap layers;
areas of said transparent layer of said second conductivity type being separated by said plurality of regions of said first conductivity type;
a common electrode of a first conductivity type disposed upon, and separated from said transparent layer by, said substrate; and
a plurality of second electrode disposed upon said insulating layer and extending from said cap layers through said openings to provide electrical contact with said transparent layer.

22. The light emitting diode array of claim 21, further comprised of said regions of said first conductivity type surrounding, and being separated from corresponding ones of said cap layers by, said areas of said transparent layer of said second conductivity type.

23. The light emitting diode array of claim 21, further comprising said cap layers being made of a light absorbing material.

24. A light emitting diode array of claim 21, further comprised of:
said luminescent layer being made of $Ga_{1-x}Al_xAs$, and
said transparent layer being made of $Ga_{1-y}Al_yAs$, wherein $y > x$.

25. The light emitting diode array of claim 21, further comprising said cap layers being doped with impurities.

26. The light emitting array of claim 21, further comprised of said cap layers being doped with impurities at a dose above $2 \cdot 10^{18}$ per cubic centimeter.

27. The light emitting diode array of claim 22, further comprised of:
said luminescent layer being made of $Ga_{1-x}Al_xAs$, and
said transparent layer being made of $Ga_{1-y}Al_yAs$, wherein $y > x$.

28. The light emitting diode array of claim 22, further comprised of said cap layers being doped with impurities at a dose above $2 \cdot 10^{18}$ per cubic centimeter.

29. A light emitting diode array, comprising:
a semiconductor substrate of a first conductivity type;
a luminescent layer of a first semiconducting material of a first conductivity type disposed upon said substrate;
a transparent layer of a second semiconducting material of a second and opposite conductivity type disposed upon said luminescent layer;
a plurality of spaced-apart cap layer of said second conductivity type doped with an impurity, disposed upon said transparent layer;
an insulating layer disposed over said transparent layer and around said cap layers, with a plurality of spaced-apart openings extending through said insulating layer to expose said transparent layer;
a plurality of regions of said first conductivity type disposed into said transparent layer, said plurality of regions being spaced-apart from said cap layer;
areas of said transparent layer of said second conductivity type being separated by said plurality of regions of said first conductivity type; and
a plurality of electrodes disposed upon said insulating layer and extending from said insulating layer through said openings to provide electrical contact with said cap layers.

30. The light emitting diode array of claim 29, further comprised of said regions of said first conductivity type surrounding, and being separated from corresponding ones of said cap layers by, said areas of said transparent layer of said second conductivity type.

31. The light emitting diode array of claim 29, further comprised of:
said luminescent layer being made of $Ga_{1-x}Al_xAs$, and
said transparent layer being made of $Ga_{1-y}Al_yAs$, wherein $y > x$.

32. The light emitting diode array of claim 29, further comprised of said cap layers being doped with impurities at a dose above $2 \cdot 10^{18}$ per cubic centimeter.

33. A light emitting diode array, comprising:
a semiconductor substrate of a first conductivity type;
a luminescent layer of said first conductivity type disposed upon said substrate, said luminescent layer exhibiting a first bandgap;
a transparent layer of a second and opposite conductivity type disposed upon said luminescent layer, said transparent layer exhibiting a second bandgap greater than said first bandgap;
a plurality of spaced-apart cap layers of said second conductivity type disposed upon said transparent layers;
an insulating layer disposed over said transparent layer and around said cap layers, with a plurality of spaced-apart openings extending through said insulating layer to expose corresponding ones of said layers;
a plurality of regions of said first conductivity type disposed into said transparent layer, said plurality of regions being spaced-apart from said cap layers; and
a plurality of electrodes disposed upon said insulating layer and extending from said insulating layer to provide electrical contact with corresponding ones of said cap layers.

34. The light emitting diode array of claim 33, further comprised of:
said luminescent layer being made of $Ga_{1-x}Al_xAs$, and
said transparent layer being made of $Ga_{1-y}Al_yAs$, wherein $y > x$.

35. The light emitting array of claim 33, further comprised of said cap layers being doped with impurities at a dose above $2 \cdot 10^{18}$ per cubic centimeter.

* * * * *

UNITED STATES PATENT AND TRADEMARK OFFICE
CERTIFICATE OF CORRECTION

PATENT NO. : 5,063,420

DATED : 5 November 1991

INVENTOR(S) : Ki-Joon KIM

It is certified that error appears in the above-identified patent and that said Letters Patent is hereby corrected as shown below:

<u>ON THE TITLE PAGE,</u>
<u>IN THE TITLE</u>

O.G. page,  replace "AN" with "A";

<u>ON THE TITLE PAGE,</u>
<u>IN THE ABSTRACT</u>

Line 9,  delete "of";

Line 11,  delete "of";

Column 1, Line 1, replace "AN" with "A";

Line 15, replace "outputing" with --outputting--;

Line 18, replace "an" (first occurrence) with --a--;

Line 23, replace "an" with --a--;

Line 43, insert --in-- after "problem", and delete "a" (second occurrence);

Line 51, replace "chip isn't flatten" with --the chip is not flat--;

Line 55, replace "for" with --of--;

Line 64, replace "Sequentially" with --sequentially--;

UNITED STATES PATENT AND TRADEMARK OFFICE
CERTIFICATE OF CORRECTION

PATENT NO. : 5,063,420

DATED : 5 November 1991

INVENTOR(S) : Ki-Joon KIM

It is certified that error appears in the above-identified patent and that said Letters Patent is hereby corrected as shown below:

Column 1, Line 68, replace "a" with --an--;

Column 2, Line 3, replace "Leaving" with --leaving--;

Line 5, replace "Converting" with --converting--;

Line 7, replace "Forming" with --forming--;

Line 9, replace "Forming" with --forming--;

Line 19, replace "an" with --a--;

Line 37, replace "said FIG's" with --the accompanying drawings--;

Line 53, delete "there is";

Line 61, delete "a" (first occurrence);

Line 68, replace "an" with --a--;

Column 3, Line 7, replace "an" with --a--;

UNITED STATES PATENT AND TRADEMARK OFFICE
CERTIFICATE OF CORRECTION

PATENT NO. : 5,063,420

DATED : 5 November 1991

INVENTOR(S) : Ki-Joon KIM

It is certified that error appears in the above-identified patent and that said Letters Patent is hereby corrected as shown below:

Column 3, line 16, insert --, an advantage of-- after "Accordingly", and replace "has advantages" with --is--.

Signed and Sealed this

Sixteenth Day of March, 1993

*Attest:*

STEPHEN G. KUNIN

*Attesting Officer*     Acting Commissioner of Patents and Trademarks